(12) United States Patent
Agirman et al.

(10) Patent No.: US 10,008,917 B2
(45) Date of Patent: Jun. 26, 2018

(54) BUS CAPACITOR BANK CONFIGURATION FOR A MULTI-LEVEL REGENERATIVE DRIVE

(71) Applicant: OTIS ELEVATOR COMPANY, Farmington, CT (US)

(72) Inventors: Ismail Agirman, Southington, CT (US); Steven M. Millett, Plainville, CT (US); Shashank Krishnamurthy, Rocky Hill, CT (US); Yang Wang, Shenzhen (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days. days.

(21) Appl. No.: 15/104,195

(22) PCT Filed: Dec. 18, 2013

(86) PCT No.: PCT/US2013/076196
§ 371 (c)(1),
(2) Date: Jun. 13, 2016

(87) PCT Pub. No.: WO2015/094238
PCT Pub. Date: Jun. 25, 2015

(65) Prior Publication Data
US 2017/0005562 A1  Jan. 5, 2017

(51) Int. Cl.
*B66B 1/32* (2006.01)
*H02M 1/00* (2006.01)
(Continued)

(52) U.S. Cl.
CPC ............... *H02M 1/00* (2013.01); *B66B 1/302* (2013.01); *B66B 1/32* (2013.01); *H02M 1/12* (2013.01);
(Continued)

(58) Field of Classification Search
CPC ........... H02M 1/00; H02M 1/12; B66B 1/302; B66B 1/32
(Continued)

(56) References Cited

U.S. PATENT DOCUMENTS 4,965,709 A * 10/1990 Ngo ..................... H02M 7/4826
318/803
4,998,054 A * 3/1991 Bose ................... H02M 7/4826
318/799
(Continued)

FOREIGN PATENT DOCUMENTS

CN 101030735 A 9/2007
CN 101953062 A 1/2011
(Continued)

OTHER PUBLICATIONS

F. Wang "Coordinated Control of Regenerative Three-level Neutral Point Clamped PWM Voltage Source Inverters." In: Industry Application Conference 2002. 37th IAS Annual Meeting. IEEE, Oct. 13, 2002, vol. 1, pp. 537-543.
(Continued)

*Primary Examiner* — David Warren
(74) *Attorney, Agent, or Firm* — Cantor Colburn LLP

(57) ABSTRACT

A regenerative drive device and a method for configuring the DC link of a regenerative drive device are disclosed. The multilevel regenerative drive device may include an inverter having a plurality of power components and a converter having a plurality of power components. The multilevel regenerative drive device may also include a direct current (DC) link bridging the inverter and the converter, the DC link including a capacitor, an inverter neutral point, and a converter neutral point independent of the inverter neutral point. Alternatively, the inverter neutral point and the converter neutral point may be connected.

16 Claims, 10 Drawing Sheets

(51) Int. Cl.
  *H02P 3/14* (2006.01)
  *H02M 1/12* (2006.01)
  *H02M 5/458* (2006.01)
  *H02M 7/487* (2007.01)
  *B66B 1/30* (2006.01)
  *H02P 3/18* (2006.01)
  *H03H 7/00* (2006.01)

(52) U.S. Cl.
  CPC ......... *H02M 5/458* (2013.01); *H02M 5/4585* (2013.01); *H02M 7/487* (2013.01); *H02P 3/14* (2013.01); *H02P 3/18* (2013.01); *H03H 7/004* (2013.01); *H02M 2001/007* (2013.01)

(58) Field of Classification Search
  USPC ........................................................ 187/289
  See application file for complete search history.

(56) References Cited

U.S. PATENT DOCUMENTS

| | | | |
|---|---|---|---|
| 5,321,599 A | 6/1994 | Tanamachi et al. | |
| 6,404,655 B1* | 6/2002 | Welches | H02M 7/4807 363/17 |
| 6,577,087 B2* | 6/2003 | Su | H02M 7/483 318/254.1 |
| 7,920,393 B2 | 4/2011 | Bendre et al. | |
| 8,796,982 B2* | 8/2014 | Li | H02P 23/12 318/706 |
| 2003/0067278 A1* | 4/2003 | Nakamura | H02P 27/08 318/400.04 |
| 2004/0130284 A1* | 7/2004 | Lee | H02P 6/10 318/400.23 |
| 2006/0033466 A1* | 2/2006 | Yamada | H02P 23/06 318/800 |
| 2010/0327793 A1* | 12/2010 | Komulainen | H02M 5/225 318/503 |
| 2011/0127837 A1* | 6/2011 | Sato | H02J 9/062 307/66 |
| 2012/0261217 A1 | 10/2012 | Agirman et al. | |
| 2012/0300514 A1* | 11/2012 | Kolar | H02J 3/1857 363/41 |
| 2013/0169035 A1* | 7/2013 | Nakashima | H02M 1/32 307/9.1 |
| 2014/0252410 A1* | 9/2014 | Laschek-Enders | H01L 27/0647 257/141 |
| 2014/0268932 A1* | 9/2014 | Gupta | H02M 7/493 363/40 |
| 2014/0300298 A1* | 10/2014 | Liu | H02P 3/22 318/380 |
| 2014/0313795 A1* | 10/2014 | Mi | H02M 1/44 363/44 |
| 2014/0327420 A1* | 11/2014 | Lee | H02M 3/07 323/282 |
| 2015/0002066 A1* | 1/2015 | Oda | H02M 5/4585 318/500 |
| 2015/0054443 A1* | 2/2015 | Swamy | H02P 27/16 318/504 |
| 2015/0162782 A1* | 6/2015 | Kanakasabai | H02J 9/062 307/23 |
| 2015/0229246 A1* | 8/2015 | Matsumoto | H02P 6/001 318/400.3 |
| 2015/0236625 A1* | 8/2015 | Cho | H02P 6/04 318/400.15 |
| 2015/0236634 A1* | 8/2015 | Han | H02K 11/0073 318/504 |
| 2015/0249400 A1* | 9/2015 | Zuckerberger | H02M 1/36 363/35 |
| 2016/0016475 A1* | 1/2016 | Toda | H02M 7/003 318/400.26 |
| 2016/0023572 A1* | 1/2016 | Reuss | B60L 1/00 318/400.27 |
| 2016/0118910 A1* | 4/2016 | Torrico-Bascope | H02M 7/487 363/131 |
| 2016/0308474 A1* | 10/2016 | Millett | B66B 1/302 |
| 2016/0308476 A1* | 10/2016 | Cirpan | H02P 7/00 |
| 2016/0311644 A1* | 10/2016 | Agirman | B66B 1/302 |
| 2016/0315540 A1* | 10/2016 | Dilley | H02M 3/158 |
| 2017/0005471 A1* | 1/2017 | Kim | H02J 3/32 |
| 2017/0029242 A1* | 2/2017 | Agirman | B66B 1/302 |
| 2017/0104422 A1* | 4/2017 | Okumura | H02M 7/487 |
| 2017/0149346 A1* | 5/2017 | Mouridsen | H02M 5/4585 |
| 2017/0158057 A1* | 6/2017 | Otani | B60L 3/0023 |
| 2017/0164519 A1* | 6/2017 | Uchida | H05K 7/20409 |

FOREIGN PATENT DOCUMENTS

| | | | |
|---|---|---|---|
| CN | 102075105 A | 5/2011 | |
| CN | 103248209 A | 8/2013 | |
| EP | 2624433 A1 * | 8/2013 | ............ H02M 7/537 |
| JP | H08149837 A | 6/1996 | |
| JP | 2011030380 A | 2/2011 | |
| WO | 2013151542 A1 | 10/2013 | |

OTHER PUBLICATIONS

International Search Report and Written Opinion PCT/US2013/076196; dated Sep. 17, 2014, 12 pages.
Samir Kouro et al. "Recent Advances and Industrial Applications of Multilevel Converters" In: IEEE Transactions on Industrial Electronics, vol. 57, No. 8. Aug. 2010, pp. 2553-2580.
Chinese First Office Action for application CN 201380081734.0, dated Feb. 26, 2018, 14 pages.

* cited by examiner

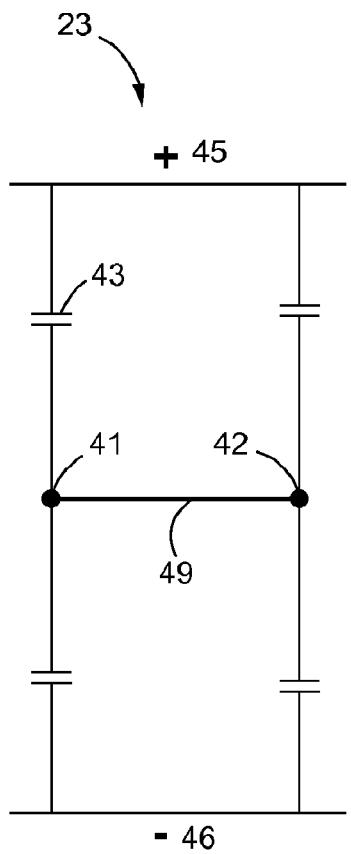 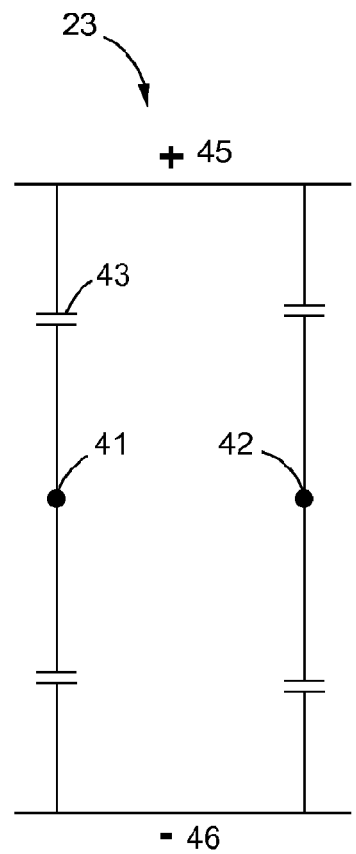
FIG. 9     FIG. 10

BUS CAPACITOR BANK CONFIGURATION FOR A MULTI-LEVEL REGENERATIVE DRIVE

TECHNICAL FIELD OF THE DISCLOSURE

The present disclosure relates to power systems and, more specifically, to a regenerative drive power system for an elevator system.

BACKGROUND OF THE DISCLOSURE

Elevator systems may be designed to operate over a specific input voltage range from a power source. The components of the drive of the elevator have voltage and current ratings that may allow the drive to continuously operate while the power supply remains within the designed input voltage range. However, in some scenarios, the local power supply of the utility network is less reliable, such as scenarios in which the utility voltage sags, brownout conditions occur (e.g., voltage conditions below the tolerance band of the elevator drive) and/or power loss conditions become prevalent. When such utility failures occur, the drive draws more current from the power supply to maintain uniform power to the hoist motor. In conventional systems, when excess current is drawn from the power supply, the drive may shut down to avoid damaging components of the drive.

When power sag or power loss occurs, the elevator may become stalled between floors in the elevator hoistway until the power supply returns to the nominal operating voltage range. In conventional systems, passengers in the elevator would be captive until a maintenance worker is able to release a brake for controlling cab movement upwardly or downwardly to allow the elevator to move to the closest floor. Elevator system designs may combat these issues during power sag or loss by employing automatic rescue operations including electrical storage devices that are controlled after power failure to provide power to move the elevator to the next floor for passenger release.

In recent elevator designs, the drive of the elevator may employ a regenerative drive system. A regenerative drive delivers power to the motor from a main power supply during the normal operating condition and delivers power from a backup power supply in the case of a power failure operating condition (e.g., power sag, power loss, etc.). Regenerative drives may include a converter on the input or power utility grid side and an inverter on the motor side, wherein power demand of the inverter is matched by an appropriate power capability on the converter. Such regenerative drives may need strict regulation by a controller to provide available power to the motor and to the backup power supply. Examples of such devices are further detailed in U.S. Patent Publication No. 2012/0261217 ("Regenerative Drive with Backup Power Supply").

A regenerative drive for an elevator has positive and negative power demands, which means that when the drive has a positive demand it may draw external power (e.g., from a local power source) and when it has negative power demands it produces electricity as a generator. Therefore, the voltages across various components must be strictly regulated and managed in regeneration scenarios, which is when the motor produces energy as a generator in negative power scenarios. A direct current (DC) link may be present, bridging the inverter and converter to smooth power output and buffer the output current of the inverter and converter.

Some recent regenerative drives may operate using a three-phase power input source. In some regenerative drives, the inverter and/or converter may be designed with multi-level topologies (e.g., a three-level regenerative drive topology). In such designs, management of acoustic noise, efficiency, neutral point stability, and thermal balancing is imperative to the success of the design. As such, a need exists to manage the neutral points of the inverter and converter at the DC link.

SUMMARY OF THE DISCLOSURE

In accordance with one aspect of the disclosure, a multilevel regenerative drive device is disclosed. The multilevel regenerative drive device may include an inverter having a plurality of power components and a converter having a plurality of power components. The multilevel regenerative drive device may also include a direct current (DC) link bridging the inverter and the converter, the DC link including a capacitor, an inverter neutral point, and a converter neutral point independent of the inverter neutral point.

In a refinement, at least one member of the plurality of power components of the inverter and at least one member of the plurality of power components of the converter may be an insular-gate bipolar transistor.

In a refinement, the plurality of power components of the inverter and the plurality of power components of the converter may be arranged having a T-type topology.

In a refinement, the plurality of power components of the inverter and the plurality of power components of the converter may be arranged having a neutral point clamped type topology.

In a refinement, the plurality of power components of the inverter and the plurality of power components of the converter may be arranged having an advanced T-type neutral point clamped topology.

In a further refinement, at least one member of the plurality of power components of the inverter and at least one member of the plurality of power components of the converter may be a reverse-blocking insular-gate bipolar transistor.

In a refinement, the inverter may operate in a unipolar pulse width modulation mode.

In a refinement, the converter may operate in a unipolar pulse width modulation mode.

In a refinement, the multilevel regenerative drive device may be a multilevel elevator drive device.

In accordance with another aspect of the disclosure, a multilevel regenerative drive device is disclosed. The multilevel regenerative drive device may include an inverter having a plurality of power components and a converter having a plurality of power components. The multilevel regenerative drive device may also include a direct current (DC) link bridging the inverter and the converter, the DC link including a capacitor and a neutral point, the neutral point shared by the inverter and the converter.

In a refinement, at least one member of the plurality of power components of the inverter and at least one member of the plurality of power components of the converter may be an insular-gate bipolar transistor.

In a refinement, the plurality of power components of the inverter and the plurality of power components of the converter may be arranged having a T-type topology.

In a refinement, the plurality of power components of the inverter and the plurality of power components of the converter may be arranged having a neutral-point-clamped topology.

In a refinement, the plurality of power components of the inverter and the plurality of power components of the converter may be arranged having an advanced T-type neutral-point-clamped topology.

In a refinement, at least one member of the plurality of power components of the inverter and at least one member of the plurality of power components of the converter may be a reverse-blocking insular-gate bipolar transistor.

In a refinement, the inverter may operate in a bipolar pulse-width modulation mode and the converter may operate in a unipolar pulse-width modulation mode.

In a refinement, the converter may operate in a bipolar pulse-width modulation mode and the inverter may operate in a unipolar pulse-width modulation mode.

In a refinement, the multilevel regenerative drive device may be a multilevel elevator drive device.

In another aspect of the disclosure, a method for configuring a DC link for a multilevel regenerative drive device is disclosed. The multilevel regenerative drive device may include an inverter having a plurality of power components and a converter having a plurality of power components. The method may include determining a neutral point associated with the inverter and determining a neutral point associated with the converter, the neutral point of the converter being independent of the neutral point associated with the inverter.

In a refinement, the method may further include connecting the neutral point associated with the inverter to the neutral point associated with the converter.

In a refinement, at least one of the inverter or the converter operates in a unipolar pulse width modulation mode.

In a further refinement, the inverter may operate in a bipolar pulse-width modulation mode and the converter may operate in a unipolar pulse-width modulation mode.

In a refinement, the multilevel regenerative drive device may be a multilevel elevator drive device.

BRIEF DESCRIPTION OF THE DRAWINGS

FIGS. 9-10 depict example DC links.

It should be understood that the drawings are not necessarily to scale and that the disclosed embodiments are sometimes illustrated diagrammatically and in partial views. In certain instances, details which are not necessary for an understanding of this disclosure or which render other details difficult to perceive may have been omitted. It should be understood, of course, that this disclosure is not limited to the particular embodiments illustrated herein.

DETAILED DESCRIPTION OF THE DRAWINGS

Figure 1:
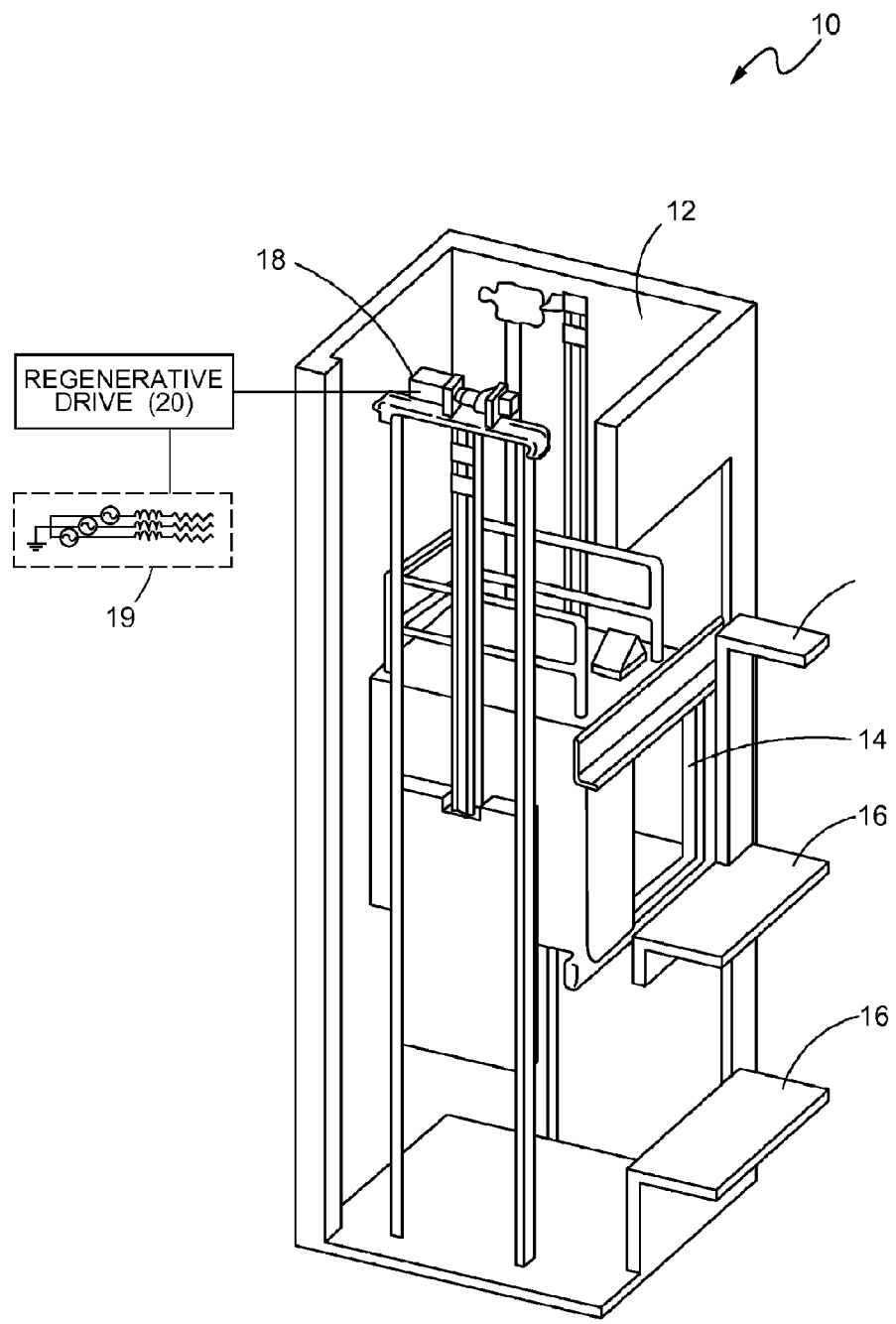
FIG. 1 is a schematic representation of an elevator system, according to one embodiment of the present disclosure.

Referring now to FIG. 1, a schematic diagram of an elevator system 10 is provided. It is to be understood that the depicted elevator system of FIG. 1 is for illustrative purposes only and to assist in disclosing various embodiments of the invention. As is understood by a person skilled in the art, FIG. 1 does not depict all of the components of an exemplary elevator system, nor are the depicted features necessarily included in all elevator systems.

The elevator system may reside fully or partially in a hoistway 12 that is vertically disposed within a building. The hoistway 12 may provide a vertical path through which an elevator car 14 may travel between floors or landings 16 of the building. A motor 18, or other prime mover, may be operatively connected to the elevator car 14 in order to generate a thrust force to move the elevator car 14 within the hoistway 12.

A power source 19 may be operatively connected to the motor 18 in order to supply power to the motor. The power source 19 may be externally generated power such as from a power utility grid. The motor 18 and power source 19 may each be three-phase. In addition, a regenerative drive 20 may be coupled to the motor 18 and the power source 19 in order to operate the motor 18 to achieve the desired elevator car 14 movement.

Figure 2:
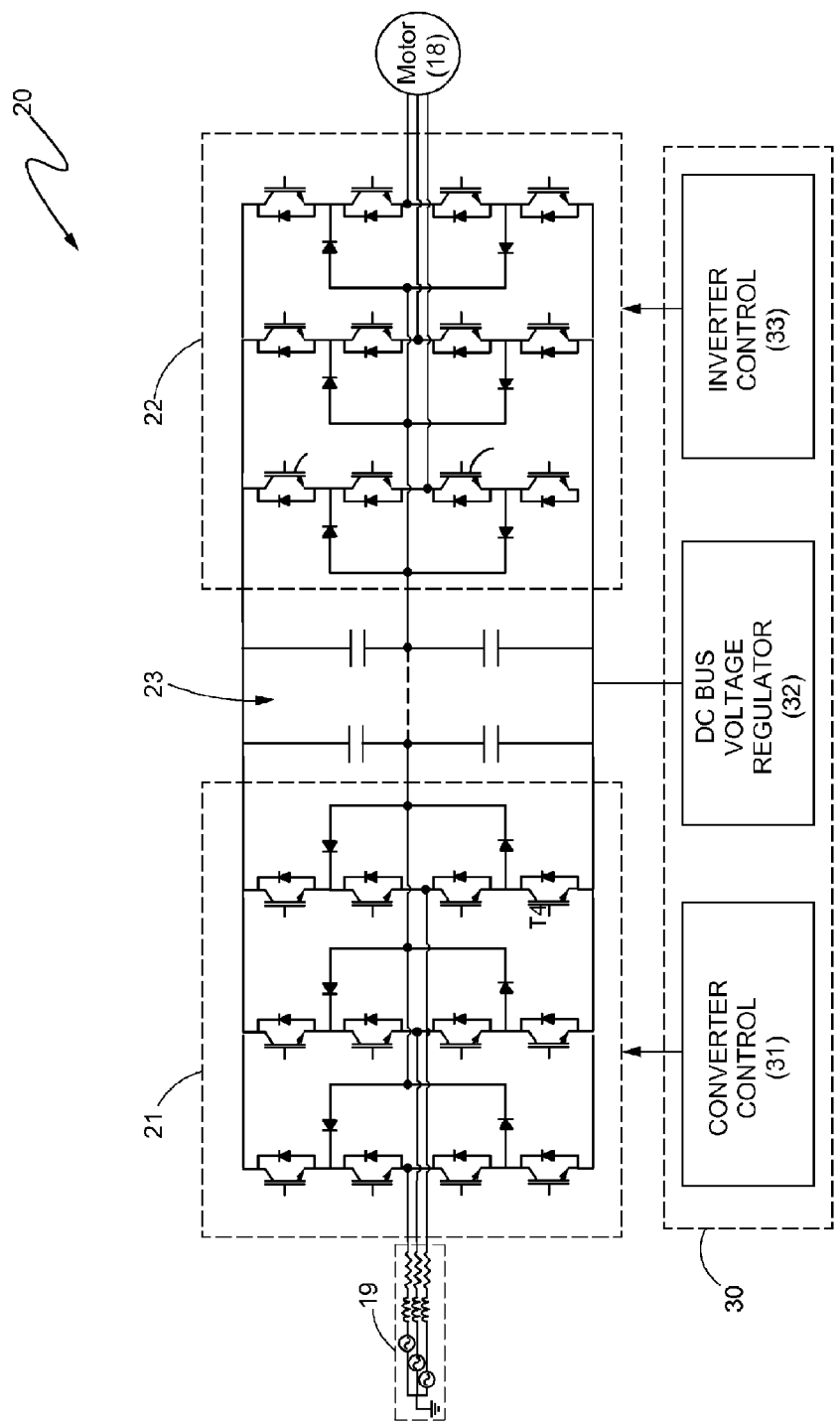
FIG. 2 is a schematic representation of a regenerative drive for the elevator system of FIG. 1.
Figure 3:
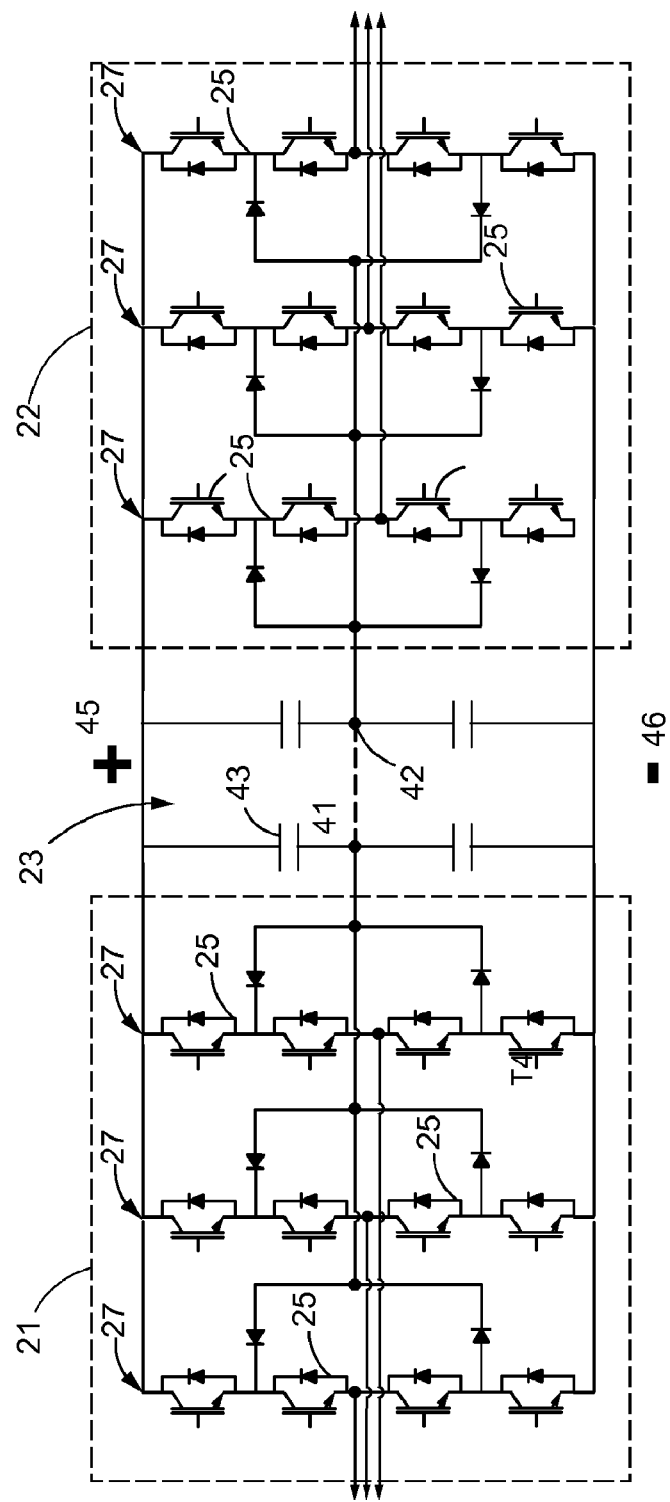
FIG. 3 is a schematic representation of the inverter and converter of the regenerative drive of FIG. 2, the inverter and converter both having a neutral point clamped (NPC) type topology.

Turning to FIGS. 2 and 3, an exemplary regenerative drive device 20 is shown. The regenerative drive 20 may generally include a converter 21 operatively associated with the power supply 19 and an inverter 22 operatively associated with the motor 18 (FIG. 3 provides a magnified view of the inverter and the converter of FIG. 2, as such like reference numbers are used throughout FIGS. 2 and 3). More specifically, the converter 21 may be operatively connected with three phases of the power source 19, the converter 21 having a phase leg for each phase of the power source 19. The inverter 22 may be operatively connected to the motor 18, the inverter 22 may have a phase leg for each phase of the motor 18. In the illustrated example, the power source 19 and motor 18 both have three phases, thusly, the converter 21 and the inverter 22 each have three phase legs. Additionally, the inverter 22 and converter 21 may be connected by a DC link 23, the DC link 23 having a positive link 45, a negative link 46, a converter neutral point 41, and an inverter neutral point 42 in association with at least one capacitor 43 to smooth the ripple current and propagating harmonics. In some examples, the converter neutral point 41 and the inverter neutral point 42 may be connected. Alternatively, the converter neutral point 41 and the inverter neutral point 42 may be independent neutral points.

Both the inverter 22 and the converter 21 may include a plurality of power devices 25, the power devices 25 grouped into the phase legs 27. Each phase leg 27 of the converter 21 may be in selective communication with each phase of the power source 19. Likewise, each phase leg 27 of the inverter 22 may be in selective communication with each phase of the motor 18. The power devices 25 in the converter 21 and inverter 22 may include a plurality of insulated gate bipolar transistors (IGBTs) and/or a plurality of diodes.

In some examples, the regenerative drive 20 may be a multilevel drive having a multilevel converter 21 and a multilevel inverter 22. In this example, the regenerative drive 20 may be a three-level drive with a three-level converter 21 and three-level inverter 22. More specifically each phase leg 27 of the multilevel converter 21 and multilevel inverter 22 may output three levels of voltage: a positive voltage, a neutral point voltage, and a negative voltage.

A controller 30 may be used to control the power devices 25 of the regenerative drive. The controller 30 may include a converter control 31, an inverter control 33, and a DC bus regulator 32. The converter control 31 and the inverter control 32 may send logic signals, respectively, to the power devices 25 of the converter 21 and the power devices 25 of the inverter 22. The DC bus voltage regulator 33 may regulate voltages associated with the positive pole 45, negative pole 44, inverter neutral point 42, and/or the converter neutral point 41 of the DC link 23. The controller 30 may comprise any non-transitory computer readable storage medium having stored thereon computer executable instructions, such as, at least one computer processor. The controller may be programmed to apply pulse width modulation (PWM) to the converter 21 and inverter 22. PWM is a modulation technique used to control the power supplied to the motor 18.

With a multilevel regenerative drive 20, e.g., the three-level converter and three-level inverter, the controller 30 may apply PWM in two modes: unipolar and bipolar; however, the controller is not limited to applying PWM in only these two modes. With reference to the phase leg 27 shown in FIG. 4, unipolar modulation comprises switching of only one pair of IGBTs, 25A and 25C, or 25B and 25D, during one PWM cycle, when applied to a phase-leg 27 of the converter 21 or inverter 22. With unipolar modulation, an output alternating current (AC) voltage may range either between a neutral potential and a positive potential or between the neutral potential and a negative potential. Unipolar modulation may provide efficiency, reduce the propagation of harmonics, and/or reduce acoustic performance benefits.

Alternatively, bipolar modulation comprises switching all of the IGBTs 25A-D during one PWM cycle, when applied to a phase leg 27 of the converter 21 or inverter 22. Switching all four devices 25A-D during one PWM cycle may achieve neutral point regulation. When using bipolar modulation, the output AC voltage may range between a positive potential and a negative potential, which includes the neutral potential. Bipolar modulation may provide neutral point stability and thermal balancing benefits. Neutral point control may result in improved ride quality of the elevator system 10, while improved thermal balancing across the converter 21 and inverter 22 may result in longer life for the power devices.

Figure 4:
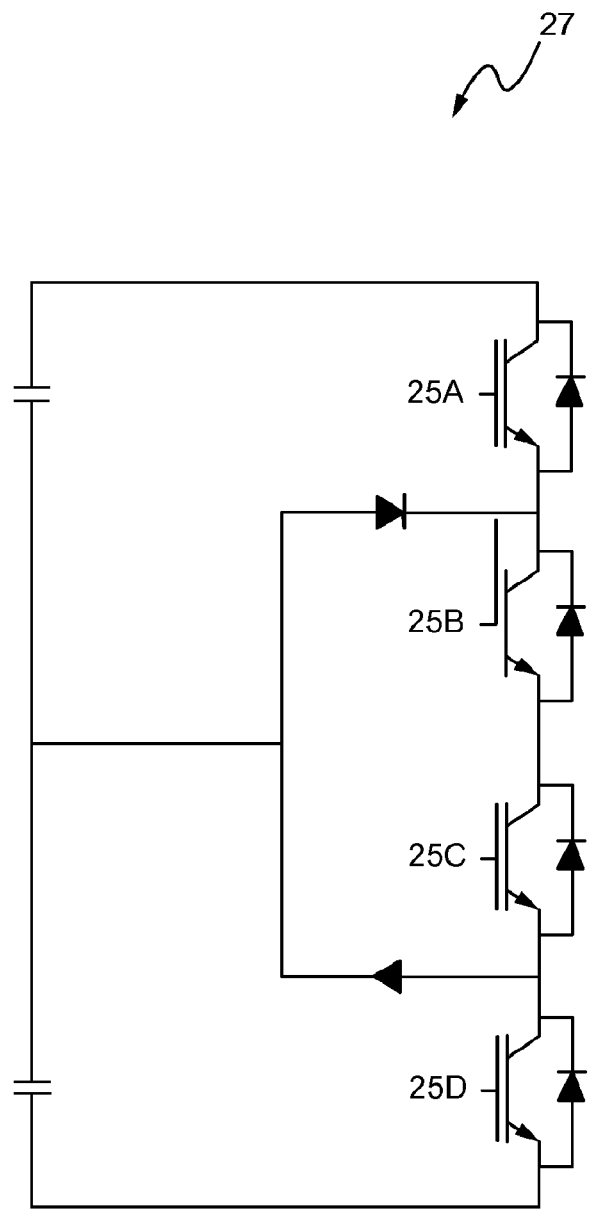
FIG. 4 is a schematic representation of a phase leg of the inverter and/or the converter of the regenerative drive of FIG. 2, the phase leg having an NPC type topology.

As seen in FIG. 3, the inverter 22 and the converter 21 for the regenerative drive system 20 have a neutral point clamped type (NPC-type) topology. Additionally, FIG. 4 shows a phase leg 27 of the inverter 22 and/or converter 21, the phase leg 27 having the same NPC-type topology. An NPC-type topology utilizes the power components 25, in this example the IGBTs 25A-D, in a series arrangement to achieve a three-level PWM operation. When the devices are in series as in the NPC-type topology, power components 25 having a lower voltage rating may be used to achieve the same voltage across the device. Using an NPC-type topology may lead to cost savings due to the use of power components 25 having lower voltage ratings because of the lower cost associated with such components.

Figure 5:
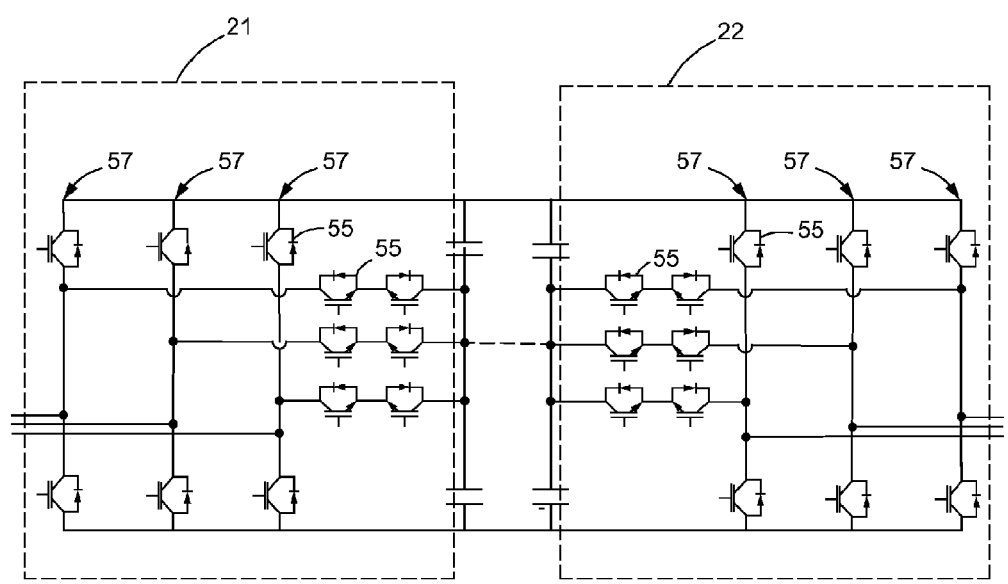
FIG. 5 is a schematic representation of the inverter and converter of the regenerative drive of FIG. 2, the inverter and converter both having a T-type topology.
Figure 6:
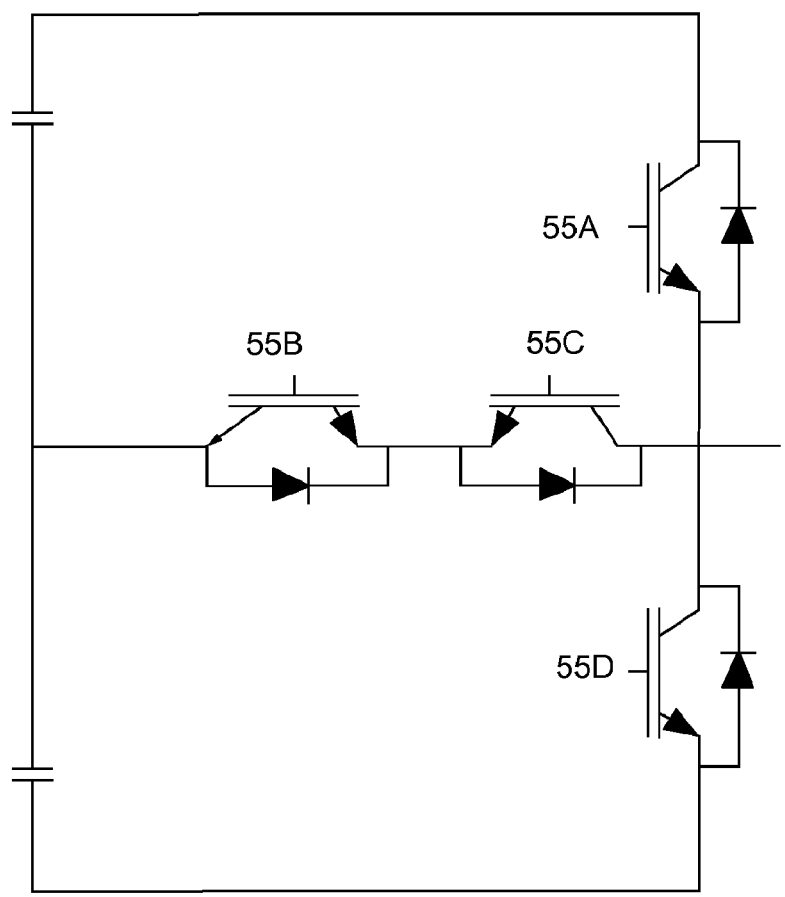
FIG. 6 is a schematic representation of a phase leg of the inverter and/or the converter of the regenerative drive of FIG. 2, the phase leg having a T-type topology.

Turning to FIG. 5, an alternative inverter 22 and an alternative converter 21 for the regenerative drive system of FIG. 2 is shown, both the inverter 21 and converter 22 having a T-type topology. Additionally, FIG. 6 shows a phase leg 57 of the inverter 22 and/or converter 22, the phase leg 57 having the same T-type topology. A T-type topology utilizes the power components 55, in this example the IGBTs 55, in an arrangement where two IGBTs 55B, 55C are in series, those two IGBTs 55B, 55C being in parallel with another pair of IGBTs 55A, 55D, which are in series. Such an arrangement lowers the voltage rating needed across each pair because they are in series and also creates greater efficiency due to the two pairs of IGBTs being in parallel.

Figure 7:
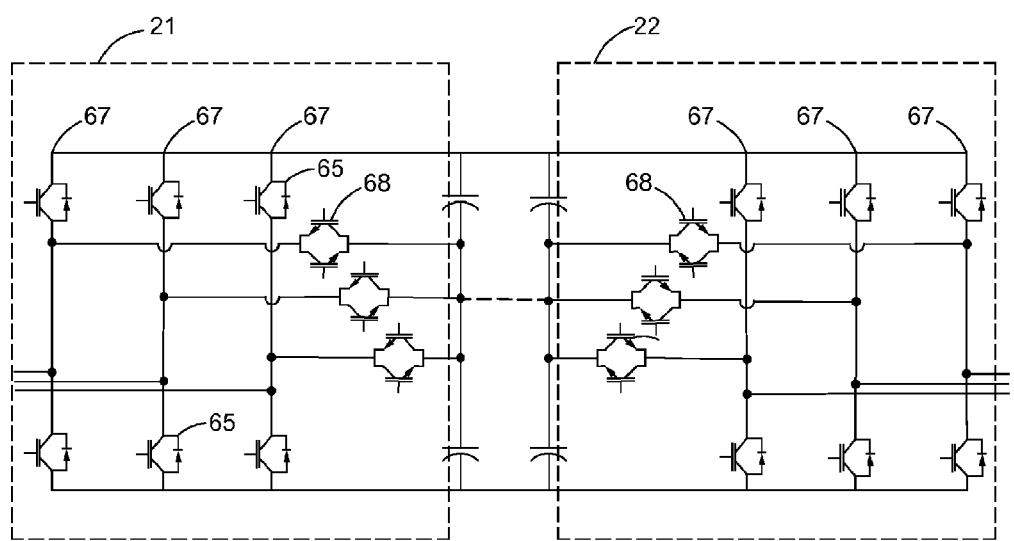
FIG. 7 is a schematic representation of the inverter and converter of the regenerative drive of FIG. 2, the inverter and converter both having an advanced T-type neutral point clamped (AT-NPC) type topology.
Figure 8:
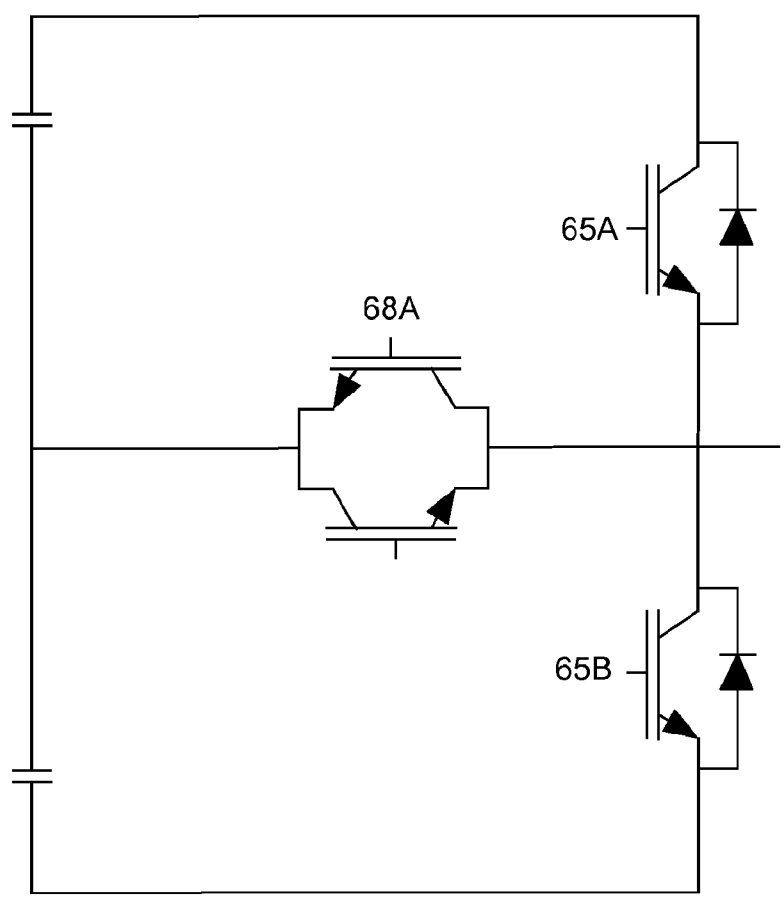
FIG. 8 is a schematic representation of a phase leg of the inverter and/or the converter of the regenerative drive of FIG. 2, the phase leg having an AT-NPC type topology.

With reference to FIG. 7, another alternative inverter 22 and alternative converter 21 for the regenerative drive system 20 is shown wherein both the inverter 22 and converter 21 have an advanced T-type neutral point clamped (AT-NPC) topology. An AT-NPC type topology is a T-type topology which incorporates reverse blocking IGBTs (RB-IGBT) 68. Additionally, FIG. 8 shows a phase leg 67 of the inverter 22 and/or converter 21, the phase leg 67 having the same AT-NPC type topology. Power components 65 of the AT-NPC type topology may include a RB-IGBT 68, the RB-IGBT 68 connected to the other power components in parallel. The AT-NPC type topology may be associated with greater efficiency.

Exemplifying a DC link for use between any of the inverter/converter combinations of FIGS. 2, 3, 5, and/or 7, FIG. 9 illustrates a DC link 23 configuration wherein the converter neutral point 41 and the inverter neutral point 42 are connected. Connecting the converter neutral point 41 and the inverter neutral point 42 may create a shared neutral point 49. The converter neutral point 41 and inverter neutral point 42 may be connected to regulate the center of the entire DC link 23 voltage, which would otherwise be regulated on each end, converter and inverter. In such configurations one of either the inverter 22 or converter 21 may operate in a bipolar PWM modulation mode (via commands from the controller) while the other member of the converter/inverter pair may operate in unipolar mode to receive benefits of unipolar operation. Such arrangements may lower acoustic noise and raise efficiency in the regenerative drive 20. Further, thermal balancing issues may be reduced when the neutral points are connected.

Alternatively, the converter neutral point 41 and the inverter 42 neutral point may be independent. As seen in FIG. 10, an example DC link 23 for use in the inverter/converter combinations of FIGS. 2, 3, 5 and/or 7 is shown. Both the inverter 22 and the converter 21 may operate in either unipolar or bipolar PWM mode. Unipolar operation may reduce the propagation of harmonics. Independent converter and inverter neutral points 41,42 may operate to decouple the effect of propagating converter harmonics and/or propagating inverter harmonics. Independent neutral points 41, 42 may allow independent unipolar and/or bipolar switching in the converter 21 and inverter 22.

Figure 11:
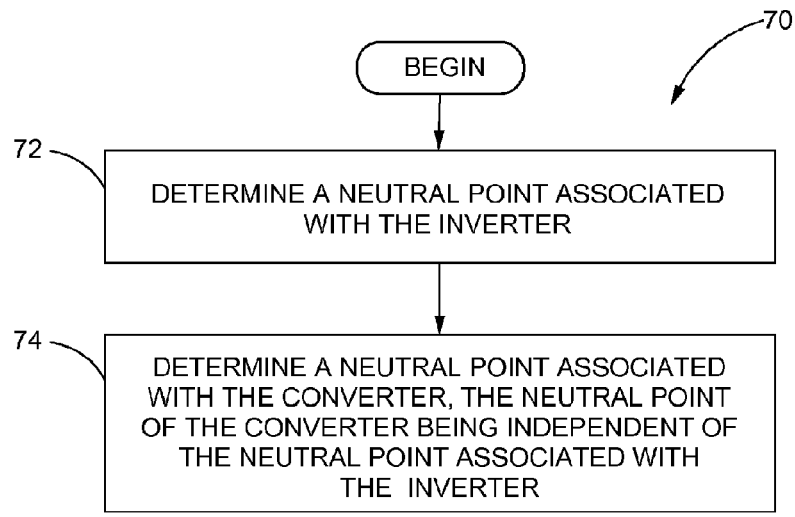
FIG. 11 is an exemplary process for configuring the neutral point for the regenerative drive of FIG. 2, wherein the inverter and converter have independent neutral points.

FIG. 11 is an exemplary process 70 for configuring the DC link 23 of the multilevel regenerative elevator drive device 20 of FIGS. 2-8. At block 72, a neutral point 42 associated with the power inverter 22 is determined. Further, at block 74, a neutral point 41 associated with the power converter 21 is determined, the neutral point 41 of the power converter 21 being independent of the neutral point 42 associated with the power inverter 22.

Figure 12:
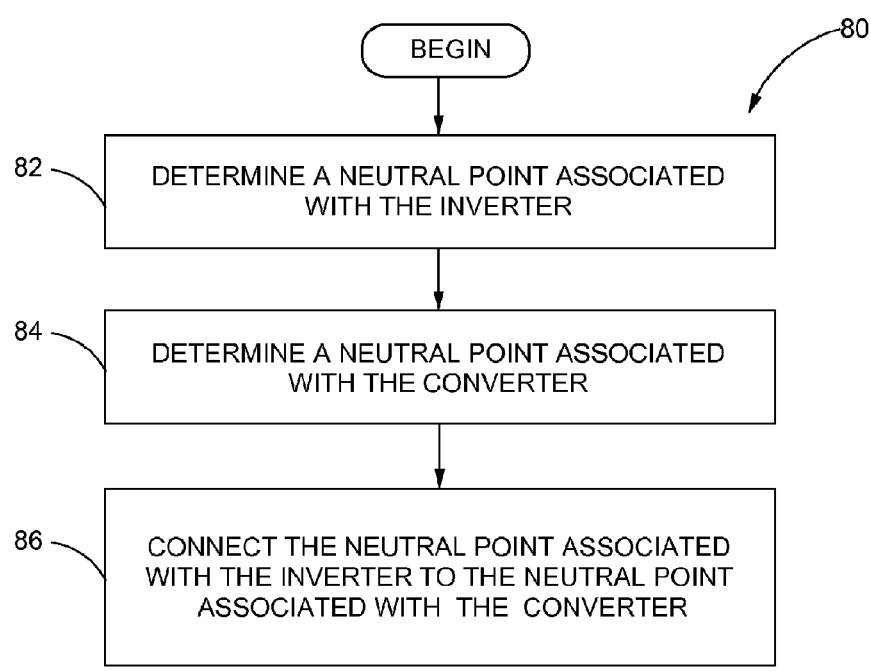
FIG. 12 is an exemplary process for configuring the neutral point for the regenerative drive of FIG. 2, wherein the inverter and converter have connected neutral points.

Turning to FIG. 12, an exemplary process 80 for configuring the DC link 23 of the multilevel regenerative elevator drive device 20 of FIGS. 2-8 is shown. At block 82, a neutral point 42 associated with the power inverter 22 is determined. Further, at block 84, a neutral point 41 associated with the power converter 21 is determined. The neutral point 41 associated with the power converter 21 and the neutral point 42 associated with the power inverter 22 are connected (block 86).

INDUSTRIAL APPLICABILITY

From the foregoing, it can be seen that the technology disclosed herein has industrial applicability in a variety of settings such as, but not limited to, systems and methods for determining a neutral point associated with a regenerative drive. The regenerative drive may be used in conjunction with an elevator system. Using the teachings of the present disclosure, multilevel regenerative drives may be produced having optimized DC link configurations. This improvement over the prior art may improve the operation of the regenerative drive by limiting propagating harmonics, lessening acoustic noise, raising the efficiency of the device, and/or lowering costs of the device.

While certain features may be described only with regard to specific embodiments above, the features are not related to use with those specific embodiments. It is understood that the disclosed features may be incorporated into additional embodiments (whether specifically described or not) wherever practicable.

While the present disclosure has been in reference to a regenerative drive for an elevator system, one skilled in the art will understand that the teachings herein can be used in other applications as well. It is therefore intended that the scope of the invention not be limited by the embodiments presented herein as the best mode for carrying out the invention, but that the invention will include all equivalents falling within the spirit and scope of the claims as well.

What is claimed is:

1. A multilevel regenerative drive device, comprising:
   an inverter having a plurality of power components;
   a converter having a plurality of power components;
   a direct current link bridging the inverter and the converter, the DC link comprising:
      a capacitor;
      an inverter neutral point; and
      a converter neutral point independent of the inverter neutral point;
   wherein one of the inverter and the converter operates in a bipolar pulse-width modulation mode and an other of the inverter and the converter operates in a unipolar pulse-width modulation mode.

2. The multilevel regenerative drive device of claim 1, wherein at least one member of the plurality of power components of the inverter and at least one member of the plurality of power components of the converter is an insular-gate bipolar transistor.

3. The multilevel regenerative drive device of claim 1, wherein the plurality of power components of the inverter and the plurality of power components of the converter are arranged having a T-type topology.

4. The multilevel regenerative drive device of claim 1, wherein the plurality of power components of the inverter and the plurality of power components of the converter are arranged having a neutral-point-clamped topology.

5. The multilevel regenerative drive device of claim 1, wherein the multilevel regenerative drive device is a multilevel regenerative elevator drive device.

6. A multilevel regenerative drive device, comprising:
   an inverter having a plurality of power components;
   a converter having a plurality of power components;
   a direct current link bridging the inverter and the converter, the DC link comprising:
      a capacitor;
      an inverter neutral point; and
      a converter neutral point independent of the inverter neutral point;
   wherein the plurality of power components of the inverter and the plurality of power components of the converter are arranged having an advanced T-type neutral point clamped topology.

7. The multilevel regenerative drive device of claim 6, wherein at least one member of the plurality of power components (65, 68) of the inverter and at least one member of the plurality of power components (65, 68) of the converter is a reverse-blocking insular-gate bipolar transistor.

8. A multilevel regenerative drive device, comprising:
   an inverter having a plurality of power components;
   a converter having a plurality of power components;
   a direct current link bridging the inverter and the converter, the DC link comprising:
      a capacitor;
      a neutral point, the neutral point shared by the inverter and the converter;
   wherein one of the inverter and the converter operates in a bipolar pulse-width modulation mode and an other of the inverter and the converter operates in a unipolar pulse-width modulation mode.

9. The multilevel regenerative drive device of claim 8, wherein at least one member of the plurality of power components of the inverter and at least one member of the plurality of power components of the converter is an insular-gate bipolar transistor.

10. The multilevel regenerative drive device of claim 8, wherein the plurality of power components of the inverter and the plurality of power components of the converter are arranged having a T-type topology.

11. The multilevel regenerative drive device of claim 8, wherein the plurality of power components of the inverter and the plurality of power components of the converter are arranged having a neutral-point-clamped topology.

12. The multilevel regenerative drive device of claim 8, wherein the multilevel regenerative drive device is a multilevel regenerative elevator drive device.

13. A multilevel regenerative drive device, comprising:
   an inverter having a plurality of power components;
   a converter having a plurality of power components;
   a direct current link bridging the inverter and the converter, the DC link comprising:
      a capacitor;
      a neutral point, the neutral point shared by the inverter and the converter;
   wherein the plurality of power components (65, 68) of the inverter and the plurality of power components (65, 68) of the converter are arranged having an advanced T-type neutral point clamped topology.

14. The multilevel regenerative drive device of claim 13, wherein at least one member of the plurality of power components of the inverter and at least one member of the plurality of power components of the converter is a reverse-blocking insular-gate bipolar transistor.

15. A method for configuring a DC link for a multilevel regenerative drive device, the multilevel regenerative elevator drive device having an inverter having a plurality of power components and a converter having a plurality of power components, the method comprising:
- determining a neutral point associated with the inverter; and
- determining a neutral point associated with the converter, the neutral point of the converter being independent of the neutral point associated with the inverter;
- wherein one of the inverter and the converter operates in a bipolar pulse-width modulation mode and an other of the inverter and the converter operates in a unipolar pulse-width modulation mode.

16. A method for configuring a DC link for a multilevel regenerative drive device, the multilevel regenerative elevator drive device having an inverter having a plurality of power components and a converter having a plurality of power components, the method comprising:
- determining a neutral point associated with the inverter;
- determining a neutral point associated with the converter, the neutral point of the converter being independent of the neutral point associated with the inverter; and
- connecting the neutral point associated with the inverter to the neutral point associated with the converter.

* * * * *